(12) United States Patent
Pickering et al.

(10) Patent No.: US 11,966,291 B2
(45) Date of Patent: Apr. 23, 2024

(54) DATA COMMUNICATION

(71) Applicant: KALIBRATE TECHNOLOGIES LIMITED, Manchester (GB)

(72) Inventors: Benjamin Pickering, Manchester (GB); Gareth Owen, Manchester (GB)

(73) Assignee: Kalibrate Technologies Limited, Manchester (GB)

( * ) Notice: Subject to any disclaimer, the term of this patent is extended or adjusted under 35 U.S.C. 154(b) by 362 days.

(21) Appl. No.: 17/287,189

(22) PCT Filed: Oct. 11, 2019

(86) PCT No.: PCT/GB2019/052904
§ 371 (c)(1),
(2) Date: Apr. 21, 2021

(87) PCT Pub. No.: WO2020/084279
PCT Pub. Date: Apr. 30, 2020

(65) Prior Publication Data
US 2021/0357292 A1    Nov. 18, 2021

(30) Foreign Application Priority Data
Oct. 25, 2018 (GB) ..................................... 1817352

(51) Int. Cl.
*G06F 11/14* (2006.01)
*H03M 13/00* (2006.01)
(Continued)

(52) U.S. Cl.
CPC ....... *G06F 11/1402* (2013.01); *H03M 13/615* (2013.01); *H04L 1/00* (2013.01);
(Continued)

(58) Field of Classification Search
CPC ............ G06F 11/1402; G06F 2201/82; H03M 13/615; H04L 1/00; H04L 1/0045;
(Continued)

(56) References Cited

U.S. PATENT DOCUMENTS 5,675,553 A * 10/1997 O'Brien, Jr. ............ G01S 11/14
367/136
6,009,437 A * 12/1999 Jacobs .................... G06T 7/579
707/999.102
(Continued)

OTHER PUBLICATIONS

International Search Report with Written Opinion for related Application No. PCT/GB2019/052904 dated Mar. 29, 2018 (12 Pages).
(Continued)

*Primary Examiner* — John J Tabone, Jr.
(74) *Attorney, Agent, or Firm* — Michael Best & Friedrich LLP

(57) ABSTRACT

There is described a method for communicating data, the method comprising: receiving an incomplete data stream, wherein the incomplete data stream comprises a plurality of sequences of data points having respective values and a plurality of sequences of missing data points; receiving a missing data model; determining values for each of the plurality of sequences of missing data points, comprising: selecting a sequence of missing data points that has not previously been processed, wherein the sequence of missing data points to be processed is selected as a smallest sequence of missing data points of the plurality of sequences of missing data points that have not previously been processed; processing the incomplete data stream to determine values for the selected sequence of missing data points based upon the missing data model; updating the incomplete data stream to include the determined values for the selected sequence of missing data points; and wherein values for subsequent sequences of missing data points are generated based upon (Continued)

the updated data stream; and outputting a corrected data stream comprising the determined values for each of the plurality of sequences of missing data points.

14 Claims, 3 Drawing Sheets

(51) Int. Cl.
*H04L 1/00* (2006.01)
*H04L 1/08* (2006.01)
*H04L 25/03* (2006.01)
*H04L 43/00* (2022.01)
*H04L 67/12* (2022.01)

(52) U.S. Cl.
CPC ...... *H04L 1/0045* (2013.01); *H04L 25/03178* (2013.01); *H04L 43/00* (2013.01); *H04L 67/12* (2013.01); *G06F 2201/82* (2013.01); *H04L 1/0041* (2013.01); *H04L 1/08* (2013.01)

(58) Field of Classification Search
CPC ... H04L 25/03178; H04L 43/00; H04L 67/12; H04L 1/0041; H04L 1/08
USPC .............. 714/747, 750; 365/224, 243, 254; 370/241; 375/224
See application file for complete search history.

(56) References Cited

U.S. PATENT DOCUMENTS

| | | | |
|---|---|---|---|
| 9,684,872 B2* | 6/2017 | Dong | G06N 7/00 |
| 2010/0274753 A1* | 10/2010 | Liberty | G06F 16/951 |
| | | | 706/50 |
| 2013/0262013 A1* | 10/2013 | Ide | G06F 17/18 |
| | | | 702/108 |
| 2016/0196235 A1* | 7/2016 | Küster | A61B 5/369 |
| | | | 702/19 |
| 2018/0091258 A1 | 3/2018 | Brittner et al. | |
| 2019/0303471 A1* | 10/2019 | Lee | G06F 16/2365 |
| 2020/0125627 A1* | 4/2020 | Küster | A61B 5/72 |
| 2021/0357292 A1* | 11/2021 | Pickering | G06F 11/1402 |

OTHER PUBLICATIONS

International Preliminary Report on Patentability for related Application No. PCT/GB2019/052904 dated Apr. 27, 2021 (9 Pages).
Search Report issued from the United Kingdom Patent office for related Application No. GB1817352.6 dated Feb. 1, 2019 (3 Pages).
International Search Report with Written Opinion for related Application No. PCT/GB2019/052904 dated Jan. 17, 2020 (12 Pages).

* cited by examiner

DATA COMMUNICATION

TECHNICAL FIELD

The present specification relates to systems and methods for communicating data between devices, in particular, where a communicated data stream comprises missing data.

BACKGROUND

The modern world is reliant upon data transmissions between devices and processing of such data. However, received data streams may be missing data preventing applications from correctly operating.

There are many reasons why a data stream may be missing data. For example, there may be a communications error during data transmission or an error during writing of received data at the receiver. Another reason for missing data may lie at the source of data, for example, the source of data may be a sensor. A sensor malfunction may cause data to not be collected and hence there may be periods where data is not generated. As such, there remains a need for improved data processing methods for handling missing data in data streams.

SUMMARY

According to a first aspect, there is provided a method for communicating data, the method comprising: receiving an incomplete data stream, wherein the incomplete data stream comprises a plurality of sequences of data points having respective values and a plurality of sequences of missing data points; receiving a missing data model; determining values for each of the plurality of sequences of missing data points, comprising: selecting a sequence of missing data points that has not previously been processed, wherein the sequence of missing data points to be processed is selected as a smallest sequence of missing data points of the plurality of sequences of missing data points that have not previously been processed; processing the incomplete data stream to determine values for the selected sequence of missing data points based upon the missing data model; updating the incomplete data stream to include the determined values for the selected sequence of missing data points; and wherein values for subsequent sequences of missing data points are generated based upon the updated data stream; and outputting a corrected data stream comprising the determined values for each of the plurality of sequences of missing data points.

In this way, the method first attempts to determine values for the smallest sequences of missing data which can then be used in the determination of values for larger sequences of missing data. The inventors have realized that by processing the smallest sequences first, the data stream may be corrected to a higher degree of accuracy than in prior art methods. In particular, initial corrections of a high accuracy can be initially generated, which can then be used to correct subsequent, larger sequences of missing data points.

By contrast, existing methods typically attempt to determine an initial estimate of values for all missing data points in the data stream at once. Such methods then attempt to iteratively improve on the estimated values based upon estimates in past iterations for the whole data stream. As such, given that missing data models often have poorer accuracy for larger sequences of missing data, such methods may produce inaccurate values for large portions of the missing data.

Furthermore, by processing each sequence of missing data points individually, starting from smallest to largest, the method is made more efficient than prior art methods that iteratively estimate values for all missing data as a whole until some convergence criteria is met.

Processing the incomplete data stream to determine values for the selected sequence of missing data points based upon the missing data model may further comprise selecting a subset of the incomplete data stream to input to the missing data model based upon the selected sequence of missing data points. The subset may be centered on the selected sequence of missing data points. Data points of the subset of the incomplete data stream may be weighted based upon a distance between a respective data point and the selected sequence of missing data points. For example, data points which are sequentially closer to the selected sequence of missing data points may be given a higher weighting than data points which are sequentially further away from the selected sequence of missing data points. In this way, data points in the local vicinity of the selected sequence of missing data points may have more influence in the determination of values for the selected sequence of missing data points.

The missing data model may be generated based upon one or more further data streams associated with the incomplete data stream. The one or more further data streams may comprise a plurality of sequences of data points having respective values and a plurality of sequences of missing data points. That is, the one or more further data streams may also be incomplete and each data stream may have sequences of missing data points at different parts of their respective data streams.

The missing data model may be generated based upon optimizing an objective function comprising a relationship between the plurality of sequences of data points having respective values in the incomplete data stream and the one or more further data streams. The missing data model may be used to predict a sequence data points having respective values in the incomplete data stream based upon the one or more further data streams and the relationship may be based upon the prediction error.

The missing data model may be based upon a linear model. In addition, or alternatively, the missing data model may be based upon a regularized model. The missing data model may be based upon a last observation carried forward technique.

The missing data model may be different for a different sequence of missing data points. The missing data model may be specific to a sequence of missing data points and may be regenerated for the sequence of missing data points. In this way, if parts of the data stream are more strongly influenced by local factors, a different missing data model may be used to model such local influences.

Processing the data stream to determine values for the selected sequence of missing data points may further comprise verifying the determined values for the selected sequence of missing data points. The verification may be based upon a magnitude of differences in the determined values and/or a frequency of change in values in the determined values. The determined values may be modified to fulfill a verification criterion.

Aspects can be combined and it will be readily appreciated that features described in the context of one aspect can be combined with other aspects.

It will be appreciated that aspects can be implemented in any convenient form. For example, aspects may be implemented by appropriated computer programs which may be carried on appropriate carrier media which may be tangible carrier media (e.g. disks) or intangible carrier media (e.g. communications signals). Aspects may also be implemented using suitable apparatus which may take the form of programmable computers running computer programs.

BRIEF DESCRIPTION OF THE DRAWINGS

Embodiments will now be described, by way of example, with reference to the accompanying drawings, in which.

DETAILED DESCRIPTION

Figure 1:
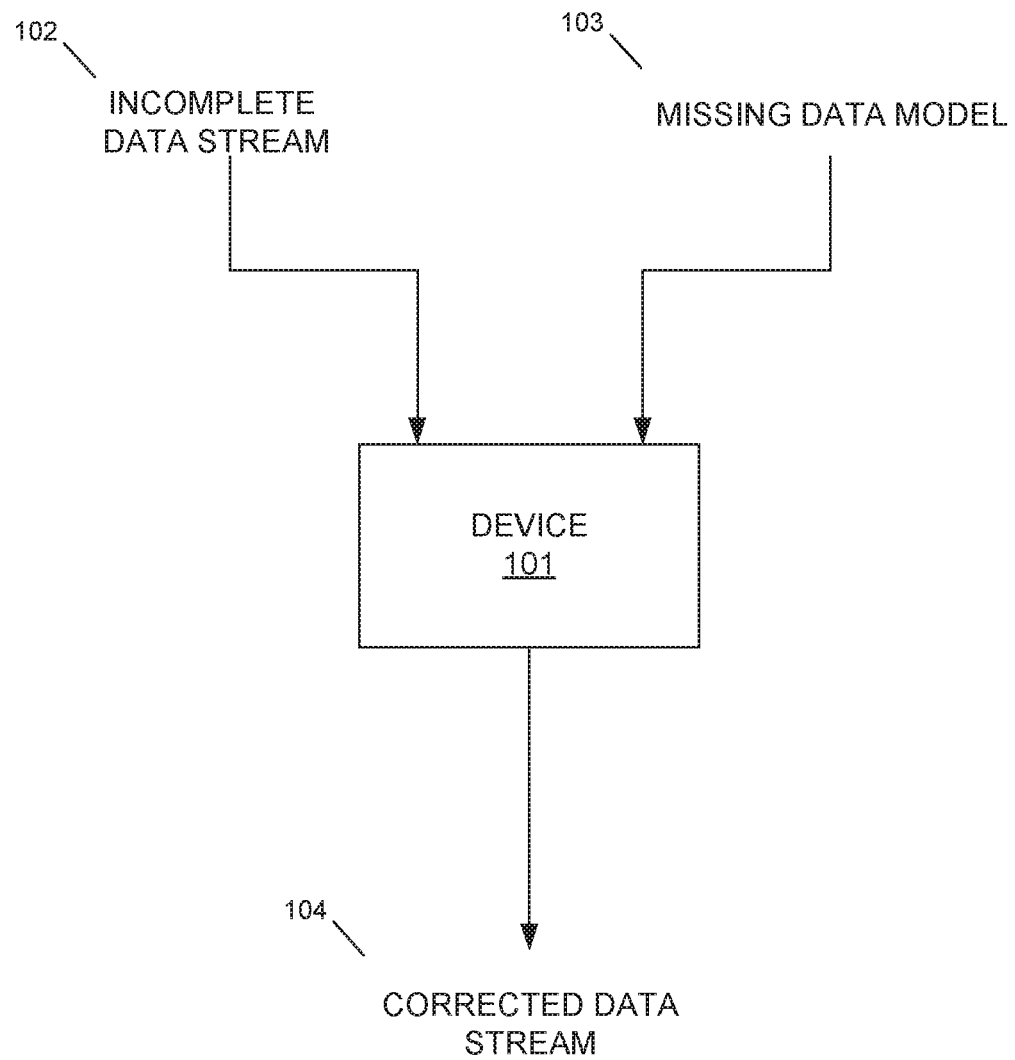
FIG. 1 is a schematic illustration of a system according to an embodiment.

Referring to FIG. 1, a device 101 is arranged to receive a data stream 102. The device 101 may be any type of computing device, for example, a server, a personal computer, a laptop, a smartphone, a tablet or other suitable processing device. The data stream 102 may be received from a second device (not shown in FIG. 1) and may be another computing device or a sensor or the like. The data stream 102 may be received remotely through a network such as the Internet or the data stream 102 may be received through a local transfer, for example, via a USB port of the device 101.

The received data stream 102 comprises a plurality of sequences of data points having respective values and a plurality of sequences of missing data points and is therefore an incomplete data stream. The missing data points may, for example, have an entry or record in the data stream 102 but may have no value or a value representative of a missing value such as a null value associated with the entry or record. In another example, the missing data points may be data points that are expected to be present in the data stream 102 but are not contained within the received data stream 102.

The data stream 102 may be any type of data. For example, the data stream 102 may be temporal or sequential data such as video data, audio data, image data, sensor data, an electronic document, and financial data such as pricing and sales data or any other type of suitable data.

The device 101 is further arranged to receive a missing data model 103. The missing data model 103 may be generated at the device 101 or the missing data model 103 may be received from another device. The missing data model 103 is configured to process a data stream having one or more sequences of missing data points to estimate values for the missing data points. The missing data model 103 may output an updated data stream comprising the estimated values for the missing data points or alternatively, the missing data model 103 may output the estimated values and the device 101 is configured to update the data stream 102 to include the estimated values for the missing data points. Further details with respect to the missing data model 103 are provided below.

The device 101 is further configured to determine values for each of the plurality of sequences of missing data points. The device 101 is configured to select a sequence of missing data points that has not previously been processed. The selected sequence of missing data points to be processed is selected as a smallest sequence of missing data points of the plurality of sequences of missing data points. The device 101 is further configured to process the data stream 102 to determine the values for the selected sequence of missing data points based upon the missing data model 103. The device 101 or the missing data model 103 is configured to update the data stream 102 to include the determined values for the selected sequence of missing data points. Values for subsequent sequences of missing data points are generated based upon the updated data stream. Once all of the sequences of the missing data points have been processed, the device 101 is configured to output a corrected data stream comprising the determined values for the missing data points.

As discussed above, it is possible to more accurately and more efficiently determine values for smaller sequences of missing data points. As such, by processing the smallest sequences first, the initial missing data points in the data stream that are corrected may be corrected to a relatively high degree of accuracy. As the initial corrected data stream is of higher accuracy, the missing data model is in turn capable of producing more accurate values for the larger sequences of missing data points. In addition, such a processing order gives rise to a more efficient process compared to prior art methods that rely upon iteratively improving estimates of values for missing data points in the data stream as a whole.

In processing a selected sequence of missing data points, the device 101 may be configured to select a subset of the data stream 102 to input to the missing data model 103 based upon the selected sequence of missing data points. For example, the subset of the data stream 102 may be a portion of the data stream 102 centered on the selected missing data sequence. Data points in the subset of the data stream 102 may be weighted. The weighting may be based upon a distance between a respective data point and the selected sequence of missing data points. For example, data points which are sequentially closer to the selected sequence of missing data points may be given a higher weighting than data points which are sequentially further away from the selected sequence of missing data points. As noted above, in this way, data points in the local vicinity of the selected sequence of missing data points may have more influence in the determination of values for the selected sequence of missing data points.

The missing data model 103 may be generated based upon one or more further data streams associated with the incomplete data stream 102. For example, the one or more further data streams may be provided by additional sensors or other data sources related to the data source that produced the incomplete data stream 102. The one or more further data streams may provide data points covering a similar time period as the data points of the incomplete data stream 102. For example, the data points of the incomplete data stream 102 and the data points of the one or more further data streams may be associated with time stamps covering a similar time period. In another example, the data streams may be transmitted or received in an overlapping time period. It is also possible that the one or more further data streams may themselves be incomplete, that is, the one or more further data streams comprise a plurality of sequences of data points having respective values and a plurality of sequences of missing data points. The device 101 may be configured to receive the one or more further data streams in order to generate the missing data model 103.

The missing data model 103 may be based upon a linear model. Processing the data stream 102 to determine values for a selected sequence of missing data points may be based upon regression. The missing data model 103 may further be based upon a regularized model. The missing data model 103 may be generated based upon the optimizing an objective function comprising a relationship between the plurality of sequences of data points having respective values in the incomplete data stream and the one or more further data streams. For example, the missing data model 103 may use the data points comprised in the one or more further data streams to predict the values of the non-missing data points in the incomplete data stream 102. The parameters of the missing data model 103 may be generated based upon optimizing a prediction error of the non-missing data points in the incomplete data stream 102. An exemplary optimization function is shown below:

$$\min_{\beta \in \mathbb{R}^p} \left\{ \frac{1}{n} \|y - X\beta\|_2^2 + \lambda f(\beta) \right\}$$

where y is a vector of n data points having respective values in the incomplete data stream that is the target of the prediction for the missing data model 103 (i.e. the non-missing data), X is a matrix of n data points from each of p further data streams; β is a vector of parameters that defines the missing data model 103, and λf(β) is a regularization term, for example, an $L_1$-norm of the β vector. As discussed above, the data points in y may be a weighted subset of the incomplete data stream 102 and X may contain a subset of data points from the one or more further data streams from a corresponding time period.

Once the model parameters, β, have been determined, values for missing data points may be determined by a linear combination of the input values to the missing data model 103, weighted by the model parameters β. The input values may be data points from the one or more further data streams from a corresponding time period as shown above.

The missing data model 103 may be different for a different sequence of missing data points. That is, the same missing data model 103 may be used for processing every sequence of missing data points, or a different missing data model 103 may be used for each sequence of missing data points, or alternatively a first missing data model 103 may be used for a first plurality of sequences of missing data points and a second missing data model 103 may be used for a second plurality of sequences of missing data points. As such, the missing data model 103 may be re-generated when processing a different selected sequence of missing data points. In this way, if parts of the data stream are more strongly influenced by local factors, a different missing data model 103 may be used to model such local influences.

The device 101 may also be configured to verify the determined values for each selected sequence of missing data points. For example, the verification may be based upon rules associated with the type of data in the data stream 102. In another example, the verification may be based upon determining whether the values are within a particular range of values or follow a particular distribution. For instance, the verification may be based upon a magnitude of differences in the determined values. The magnitude of differences in the determined values may be compared to the magnitude of differences in the non-missing data points. Should the differences between the determined values and the non-missing values exceed a threshold, the determined values may be determined to be invalid. In another instance, the frequency of changes in the determined values and the non-missing values may be compared as an alternative or in addition to the magnitude of differences.

If the determined values are found not to be acceptable by the verification, then the device 101 may be configured to modify the determined values to be within an acceptable range. For example, the determined values may be modified such that the magnitude of differences in the determined values is within the verification threshold. In another example, the values may be modified such that the frequency of changes in the determined values is within the verification threshold.

Alternatively, the missing data model 103 may be regenerated to re-determine values for the respective sequence of missing data points. For example, the missing data model 103 may be regenerated with different initialization conditions or using different data for which the model is based.

Figure 1A:
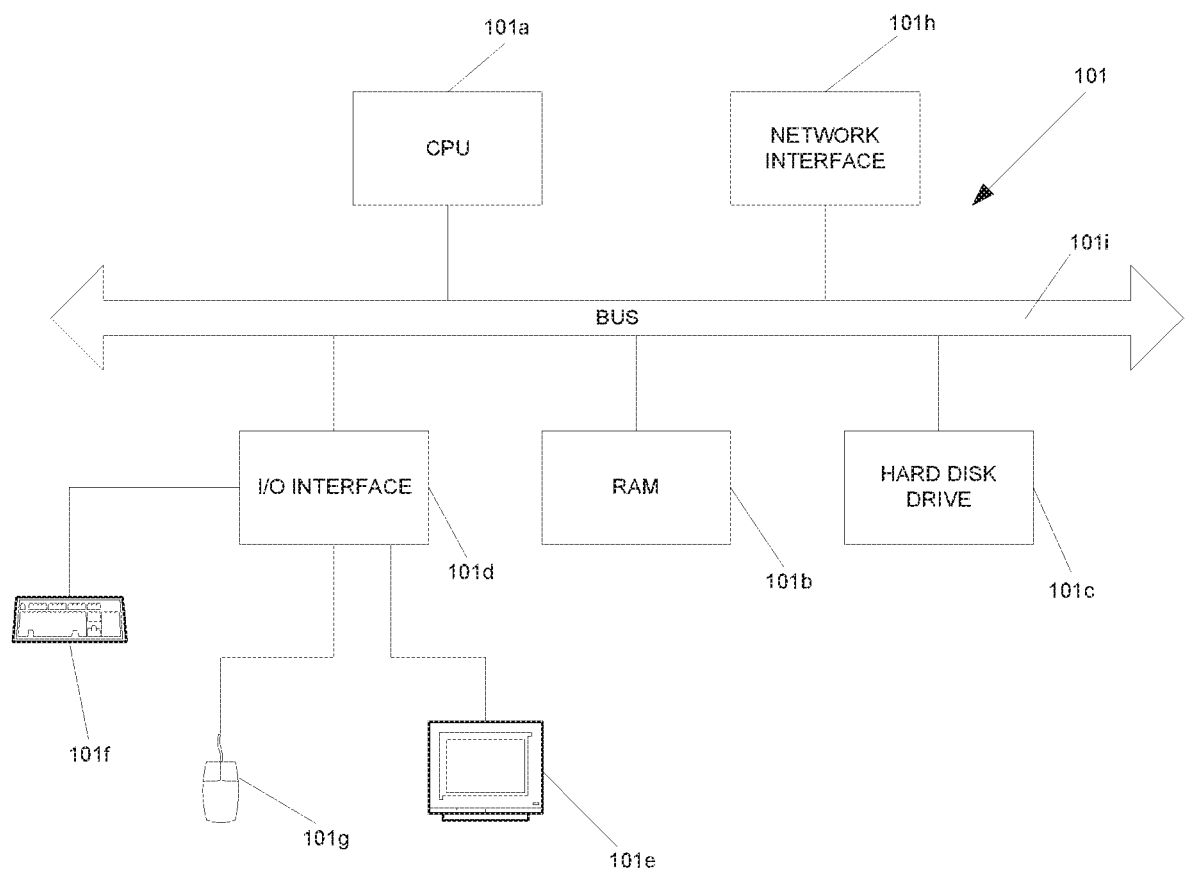
FIG. 1A is a schematic illustration of a device of the system of FIG. 1 in more detail.

FIG. 1A shows the device 101 of FIG. 1 in further detail. It can be seen that the device 101 comprises a CPU 101a which is configured to read and execute instructions stored in a volatile memory 101b which takes the form of a random access memory. The volatile memory 101b stores instructions for execution by the CPU 101a and data used by those instructions. For example, in use, the data stream 102 may be stored in volatile memory 101b.

The computer 101 further comprises non-volatile storage in the form of a hard disc drive 101c. For example, the missing data model 103 may be stored on the hard disc drive 101c. The computer 101 further comprises an I/O interface 101d to which are connected peripheral devices used in connection with the computer 101. More particularly, a display 104e is configured so as to display output from the computer 101. The display 104e may, for example, display the corrected data stream 104. Input devices are also connected to the I/O interface 101d. Such input devices include a keyboard 101f and a mouse 101g which allow interaction with the computer 101. Other input devices may also include gesture-based input devices. A network interface 101h allows the computer 101 to be connected to an appropriate computer network so as to receive and transmit data from and to other computing devices. The CPU 101a, volatile memory 101b, hard disc drive 101c, I/O interface 101d, and network interface 101h, are connected together by a bus 101i.

Although specific embodiments of the invention have been described above, it will be appreciated that various modifications can be made to the described embodiments without departing from the spirit and scope of the present invention. That is, the described embodiments are to be considered in all respects exemplary and non-limiting. In particular, where a particular form has been described for particular processing, it will be appreciated that such processing may be carried out in any suitable form arranged to provide suitable output data.

Figure 2:
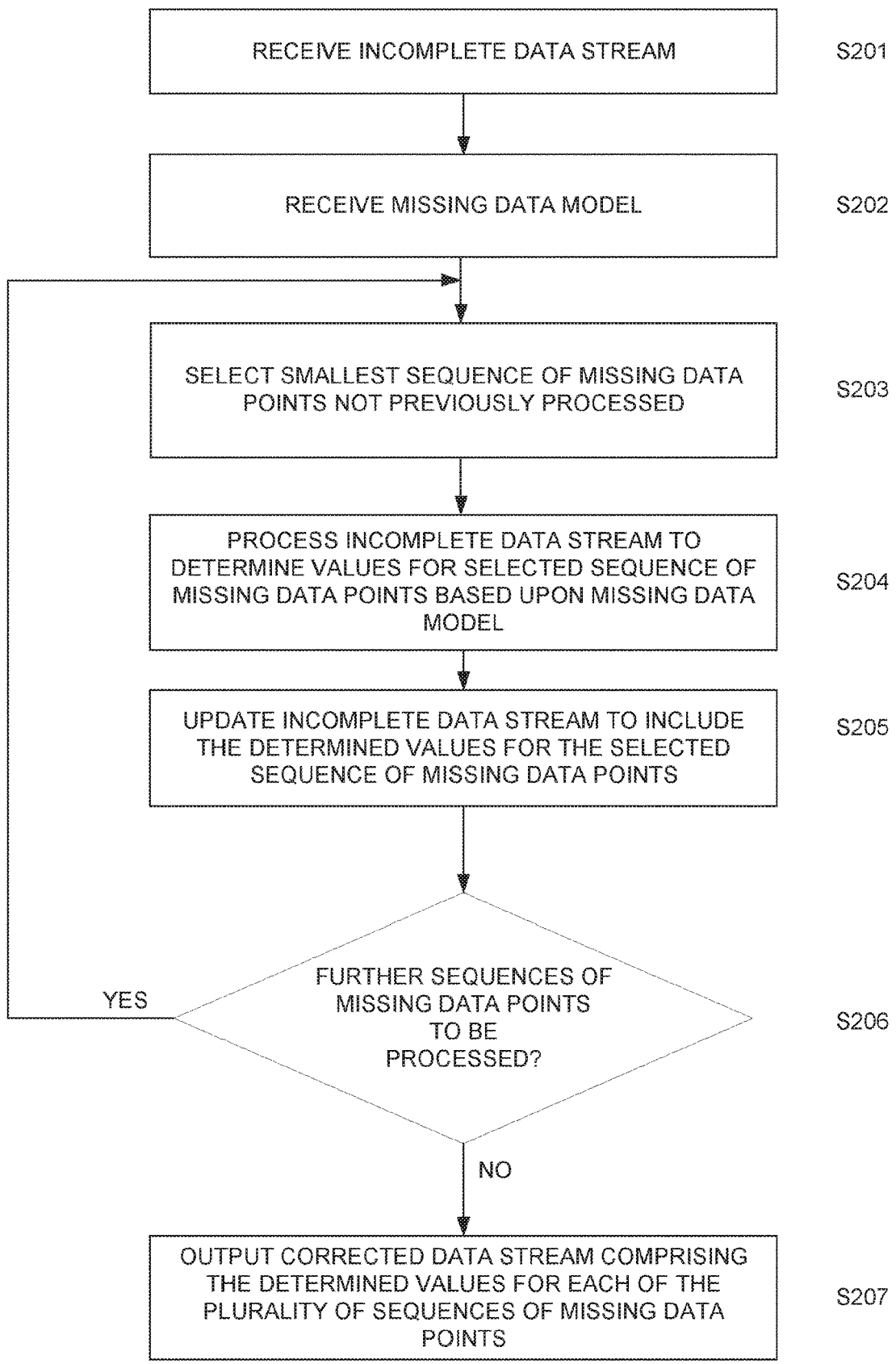
FIG. 2 is a flowchart showing processing carried out for communicating data.

Referring now to FIG. 2, a process for communicating data is show. As will be appreciated, the process may be implemented by the system of FIG. 1.

At step S201, a data stream 102 is received. The data stream 102 is incomplete in that the data stream 102 comprises a plurality of sequences of data points having respective values and a plurality of sequences of missing data points. As noted above, the missing data points may, for example, have an entry or record in the data stream 102 but may have no value or a value representative of a missing value such as a null value associated with the entry or record. In another example, the missing data points may be data points that are expected to be present in the data stream 102 but are not contained within the received data stream 102.

At step S202, a missing data model 103 is received. As discussed above, the missing data model 103 is configured to process a data stream having one or more sequences of missing data points to estimate values for the missing data points.

Values for each of the plurality of sequences of missing data points are then determined in steps S203 to S205. At step S203, a sequence of missing data points that has not previously been process is selected. The selected sequence is the smallest sequence of missing data points of the plurality of missing data points that has not yet been processed.

At step S204, the incomplete data stream 102 is processed to determine values for the selected sequence of missing data points based upon the missing data model 103. The processing may comprises selecting a subset of the data stream 102 to input to the missing data model 103. For example, the subset of the data stream 102 may be a portion of the data stream 102 centered on the selected missing data sequence. The data points in the subset may also be weighted based upon a distance between a respective data point and the selected sequence of missing data points. For example, data points which are sequentially closer to the selected sequence of missing data points may be given a higher weighting than data points which are sequentially further away of the selected sequence of missing data points. The weighted subset of the data points may then be input to the missing data model 103 for processing to determine values for selected sequence of missing data points.

After determining values for the selected sequence of missing data points, at step S205, the data stream 102 is updated to include those determined values. At step S206, it is determined whether there are further sequences of missing data points to be processed. If so, processing returns to step S203 where a further sequence of missing data points is processed using the updated data stream obtained from S205.

If there are no further sequences of missing data points to process, a corrected data stream comprising the determined values for each of the plurality of sequences of missing data points is output at step S207.

Optionally, at step S204, for processing another sequence of missing data points, the missing data model 103 may be regenerated. The missing data model 103 may be generated especially for processing the particular sequence of missing data points or the missing data model 103 may be generated for use with processing multiple sequences of missing data points as deemed appropriate by a person skilled in the art.

As described above, the missing data model 103 may be generated based upon one or more further data streams associated with the incomplete data stream 102 and may be generated based upon an optimization of objection function comprising a relationship between the plurality of sequences of data points having respective values in the incomplete data stream and the one or more further data streams. For example, the missing data model 103 may use the data points comprised in the one or more further data streams to predict the values of the non-missing data points in the incomplete data stream 102. The parameters of the missing data model 103 may be generated based upon optimizing a prediction error of the non-missing data points in the incomplete data stream 102.

After values have been determined for the selected sequence of missing data points at step S205, the values may be verified for validity prior to updating the data stream 102 with the determined values. As described above, verification of the determined values may be based upon rules associated with the type of data in the data stream 102, whether the values are within a particular range of values or follow a particular distribution or any other criterion deemed appropriate by the person skilled in the art. For example, the verification may be based upon a magnitude of differences in the determined values. The magnitude of differences in the determined values may be compared to the magnitude of differences in the non-missing data points. Should the differences between the determined values and the non-missing values exceed a threshold, the determined values may be determined to be invalid. In another example, the frequency of changes in the determined values and the non-missing values may be compared as an alternative or in addition to the magnitude of differences.

If the determined values are found to be acceptable, then processing proceeds to step S206 where the data stream 102 is updated to include the determined values. Otherwise, the determined values may be modified such that the modified values fulfill the verification criterion. For example, the determined values may be modified such that the magnitude of differences in the determined values is within the verification threshold or the values may be modified such that the frequency of changes in the determine values is within the verification threshold. The data stream may then be updated to include the modified values at step S206.

Although specific embodiments of the invention have been described above, it will be appreciated that various modifications can be made to the described embodiments without departing from the spirit and scope of the present invention. That is, the described embodiments are to be considered in all respects exemplary and non-limiting. In particular, where a particular form has been described for particular processing, it will be appreciated that such processing may be carried out in any suitable form arranged to provide suitable output data.

The invention claimed is:

1. A method of communicating data comprising:
receiving a first data stream, the first data stream being an incomplete data stream, wherein the incomplete data stream comprises a plurality of sequences of data points having respective values and a plurality of sequences of missing data points;
receiving a missing data model generated based on one or more second data streams;
determining values for each of the plurality of sequences of missing data points, comprising:
selecting a sequence of missing data points from the plurality of sequences of missing data points, wherein the selected sequence of missing data points is a smallest sequence of missing data points of the plurality of sequences of missing data points that has not previously been processed by the missing data model;
determining estimated values for the selected sequence of missing data points using the missing data model;
updating the incomplete data stream to include the determined estimated values for the selected sequence of missing data points; and
wherein values for subsequent sequences of missing data points from the plurality of sequences of missing data points are generated based upon the updated incomplete data stream; and
outputting a corrected data stream comprising the determined estimated values for each of the plurality of sequences of missing data points.

2. The method of claim 1, wherein determining the estimated values for the selected sequence of missing data points using the missing data model further comprises:

selecting a subset of the incomplete data stream to input to the missing data model based upon the selected sequence of missing data points.

3. The method of claim 2, wherein the subset is centered on the selected sequence of missing data points.

4. The method of claim 2, wherein data points of the subset of the incomplete data stream are weighted based upon a distance between a respective data point and the selected sequence of missing data points.

5. The method of claim 1, wherein the one or more second data streams comprise a plurality of sequences of data points having respective values and a plurality of sequences of missing data points.

6. The method of claim 1, wherein the missing data model is generated based upon optimising an objective function comprising a relationship between the plurality of sequences of data points having respective values in the incomplete data stream and the one or more second data streams.

7. The method of claim 6, wherein the relationship is based upon predicting the plurality of sequences of data points having respective values in the incomplete data stream based upon the one or more second data streams.

8. The method of claim 1, wherein the missing data model is based upon a linear model.

9. The method of claim 1, where in the missing data model is based upon a regularized model.

10. The method of claim 1, wherein processing the data stream to determine estimated values for the selected sequence of missing data points further comprises:
verifying the determined estimated values for the selected sequence of missing data points.

11. The method of claim 10, wherein the verification is based upon a comparison of a magnitude of differences in the determined estimated values to a magnitude of differences in non-missing data points in the incomplete data stream.

12. The method of claim 10, wherein the verification is based upon a comparison of a frequency of change in values in the determined estimated values to a frequency of change in values of non-missing data points in the incomplete data stream.

13. A computer apparatus for communicating data comprising:
a memory storing processor readable instructions;
a processor arranged to read and execute instructions in said memory; wherein said processor readable instructions comprise instructions arranged to control the computer to carry out a method according to claim 1.

14. A non-transitory computer readable medium carrying computer readable instructions configured to cause a computer to carry out a method according to claim 1.

* * * * *